(12) United States Patent
Czuba et al.

(10) Patent No.: US 9,374,915 B2
(45) Date of Patent: Jun. 21, 2016

(54) BACKPLANE CONFIGURATION FOR USE IN ELECTRONIC CRATE SYSTEMS

(71) Applicants: Deutsches Elektronen-Synchrotron DESY, Hamburg (DE); Warsaw University of Technology Institute of Electronic Systems, Warsaw (PL)

(72) Inventors: Krzysztof Czuba, Warsaw (PL); Tomasz Jezynski, Hamburg (DE); Frank Ludwig, Norderstedt (DE); Holger Schlarb, Hamburg (DE)

(73) Assignees: Warsaw University of Technology Institute of Electronic Systems, Warsaw (PL); Deutsches Elektronen-Synchrotron DESY, Hamburg (DE)

( * ) Notice: Subject to any disclaimer, the term of this patent is extended or adjusted under 35 U.S.C. 154(b) by 140 days.

(21) Appl. No.: 13/914,378

(22) Filed: Jun. 10, 2013

(65) Prior Publication Data
US 2013/0329392 A1 Dec. 12, 2013

(30) Foreign Application Priority Data
Jun. 8, 2012 (DE) .................................... 12004371

(51) Int. Cl.
*H05K 1/11* (2006.01)
*H05K 1/14* (2006.01)
(Continued)

(52) U.S. Cl.
CPC ............ *H05K 5/0004* (2013.01); *H05K 7/1445* (2013.01)

(58) Field of Classification Search
CPC ........................... H05K 5/0004; H05K 7/1445

USPC .............. 361/788, 790, 803; 174/102 R, 107, 174/70 B, 70
See application file for complete search history.

(56) References Cited

U.S. PATENT DOCUMENTS 6,154,373 A * 11/2000 Durston et al. ............... 361/788
6,757,177 B2 * 6/2004 Harris et al. .................. 361/788
6,935,868 B1    8/2005 Campini et al.
(Continued)

FOREIGN PATENT DOCUMENTS

EP          0473830 A1      3/1992
EP          1933325 A2      6/2008

OTHER PUBLICATIONS

European Search Report from European Patent Application No. 12004371.6 entitled Backplane Configuration for Use in Electronic Crate Systems (Dated Feb. 6, 2013).
(Continued)

*Primary Examiner* — Yuriy Semenenko
(74) *Attorney, Agent, or Firm* — Hovey Williams LLP

(57) ABSTRACT

The invention relates to a backplane configuration for use in an electronic crate system, said backplane configuration comprising a first-type backplane and a second-type backplane; wherein the first-type backplane is coupled to the second-type backplane by mechanical connection means; wherein the first-type backplane and the second-type backplane are spatially separated from each other by a distance which is sufficient such that electromagnetic interferences between the first-type backplane and the second-type backplane are eliminated or at least minimized; and wherein the first-type backplane is adapted to be electrically coupled with at least one first-type module, and the second-type backplane is adapted to be electrically coupled with at least one second-type module.

19 Claims, 2 Drawing Sheets

Figure 1:
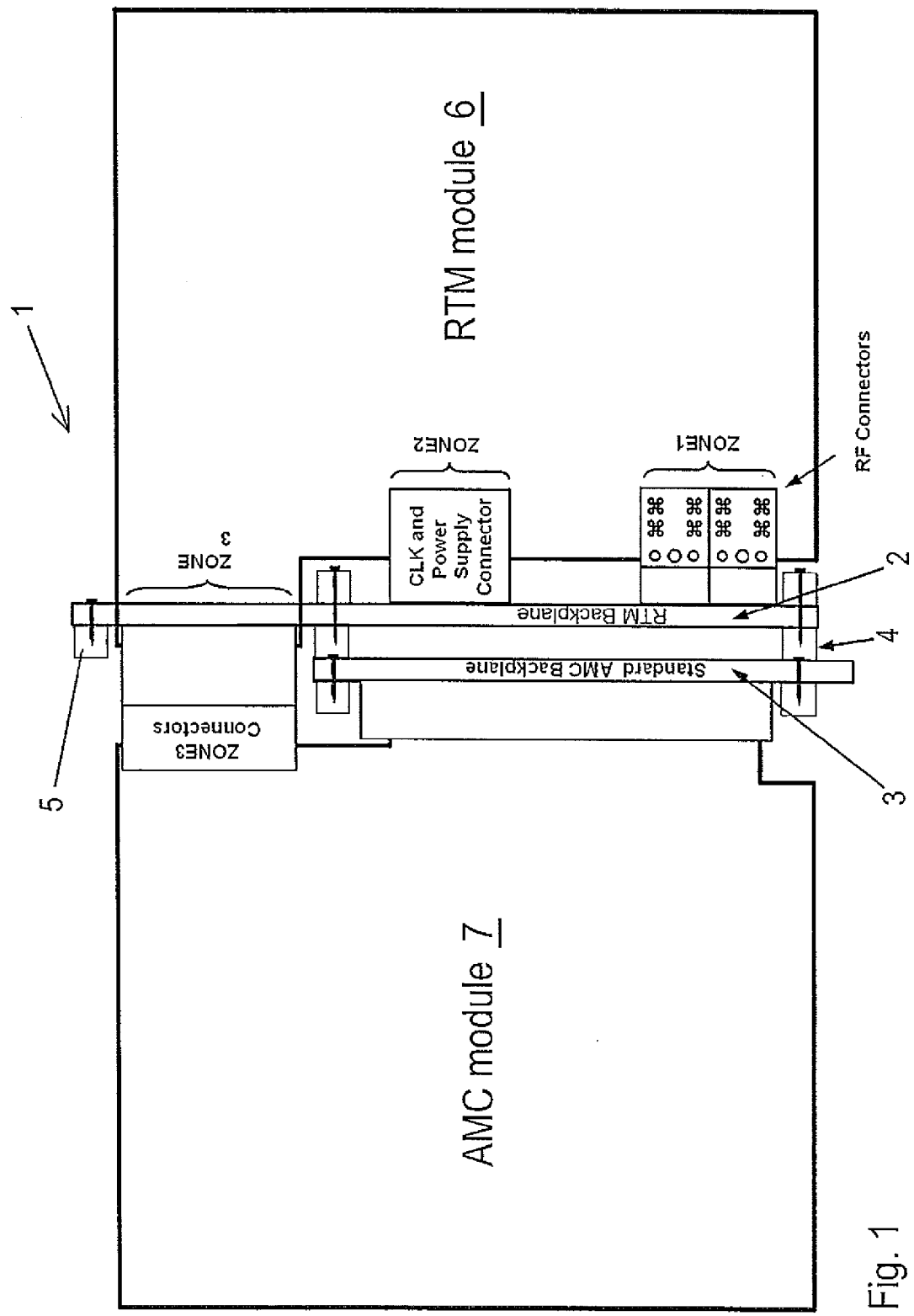

(51) Int. Cl.
*H05K 5/00* (2006.01)
*H05K 7/14* (2006.01)

(56) References Cited

U.S. PATENT DOCUMENTS

| | | | |
|---|---|---|---|
| 7,780,455 B2* | 8/2010 | Leigh et al. .................... | 439/61 |
| 8,184,450 B1* | 5/2012 | Goergen ....................... | 361/788 |
| 2007/0083690 A1* | 4/2007 | Koga et al. .................... | 710/301 |
| 2008/0148303 A1* | 6/2008 | Okamoto et al. ............. | 720/652 |

OTHER PUBLICATIONS

Ray Larson, "Introduction to MicroTCA", SLAC MicroTCA Standards Review (dated Jun. 4-5, 2012).

Stuart Jamieson, "Micro Telecommunications Computer Architecture Short Form Specification" Emerson Network Power, Embedded Computing (dated Sep. 21, 2006).

* cited by examiner

BACKPLANE CONFIGURATION FOR USE IN ELECTRONIC CRATE SYSTEMS

CROSS-REFERENCE TO RELATED APPLICATIONS

This application claims the benefit of German Patent Application Serial No. 12004371.6, filed Jun. 8, 2012, which is incorporated herein by reference in its entirety.

BACKGROUND OF THE INVENTION

1. Field of the Invention

The present invention relates in general to a backplane configuration for use in electronic crate systems, especially in electronic crate standard systems. In particular, the invention relates to a backplane configuration for use in electronic crate systems comprising a first backplane and a second backplane, wherein the first backplane can be a standard backplane, and the second backplane can be a special purpose backplane. For example, both backplanes can be configured for different types of signals which different types of signals can be analog signals and digital signals, or high-precision low-noise synchronous signal and high-speed (or ultrafast) asynchronous signals. In a special application, one of the backplanes is an RTM-backplane (RTM=Rear Transition Module), and the other backplane is AMC-backplane (AMC=Advanced Mezzanine Card). The configuration of two backplanes (as defined above) according to the invention is referred hereafter as "backplane configuration" or "high-frequency backplane configuration" when the high-frequency or high-speed signals are used. In case the first backplane is an AMC-backplane (or any other type of standard backplane), and the second backplane is an RTM-backplane, the inventive configuration of these two backplanes for use in electronic crate systems is designated as "RTM-backplane configuration". By means of the backplane configuration (and the RTM-backplane configuration) of the present invention, the functionality of an electronic crate (standard) system can be improved and extended by providing, for example, ultra-stable high frequency interconnections and high precision clock interconnections together with a high performance analog power supply for the modules coupled to the respective backplanes, for example RTM modules in case of the RTM-backplane.

Electronic crate systems are preferably used for applications where multichannel RF front-ends or analog signal conditioning modules are used together with powerful digital signal processing and data computation systems in a common crate system. In a preferred embodiment, the backplane configuration (for example the RTM-backplane configuration) of the present invention is introduced to the MTCA.4 (Micro Telecommunication Computing Architecture) crate standard system without affecting standard functionality of this crate system. However, the backplane configuration or RTM-backplane configuration of the present invention can also be used with other crate systems or crate standard systems.

2. Discussion of the Prior Art

Modular systems and modular crate systems are typically used in communication networks, computer networks or other data processing networks where reliability, high-frequency data processing and high-speed data transmission are important factors. A key component of such a modular system is the modular platform. Such a modular platform usually includes a backplane that is provided with various types of interconnections. These interconnections may include several slots, interfaces and/or IO-connections for receiving and electrically coupling several modules that provide additional functionality to the modular system. These modules may include front accessible modules and rear transition modules such as AMC modules and RTM modules, or, more general standard modules and special purpose modules configured for processing different types of signals, such as high-speed asynchronous signals and high-precision low-noise synchronous signals.

Nowadays, crate standard systems provide powerful computing platforms with large flexibility of configuration and high reliability features. As an example, in late 2011 the MTCA.4 specification released by PICMG® defined the Rear Transition Module (RTM) for the MTCA crate system. These RTM modules are active and hot-swappable. The MTCA crate system includes rear RTM modules and front AMC (Advanced Mezzanine Card) modules. The rear RTM modules are adapted to be directly connected to front AMC modules by so called Zone3 connectors providing for RTM power supply, IPMI-based management, hot-swap signals and user defined IO signals. It was commonly approved that digital subsystems can occupy standard front AMC modules, and the analog applications can be implemented on rear RTM modules. By such layout physical separation of analog and digital domains is achieved and higher system performance can be assured.

The biggest problem of such crate systems is the provision of high-frequency interconnections between the RTM modules and the quality of power supply voltage derived from the digital AMC modules. Up to now, high precision high frequency signals and low jitter clocks have to share a single backplane (the standard AMC-backplane) in the crate standard systems with highly asynchronous digital signals and communications buses (e.g. PCIe, Ethernet, SATA etc.) with data transfer rates of one (1) Gbps to forty (40) Gbps, which complicates and limits the signal-integrity and therefore the performance of the existing crate standards. In addition, external RTM interconnections realized with cables significantly reduces the reliability, maintainability and performance of entire crate system.

SUMMARY

In the view of the foregoing discussion, it is therefore the general object of the present invention to overcome the above mentioned problems. In particular, it is an object of the present invention to improve prior art electronic crate systems by providing an additional backplane (preferably a special purpose backplane, and more preferred an RTM-backplane) to the already existing standard backplane (preferably an AMC-backplane).

According to one aspect of the present invention, a backplane configuration for use in an electronic crate system is provided. The backplane configuration comprises a first-type backplane and a second-type backplane. The first-type backplane is coupled to the second-type backplane by mechanical connection means. The first-type backplane and the second-type backplane are spatially separated from each other by a distance which is sufficient such that electromagnetic interferences between the first-type backplane and the second-type backplane are eliminated or at least minimized. The first-type backplane is adapted to be electrically coupled with at least one first-type module, and the second-type backplane is adapted to be electrically coupled with at least one second-type module.

It is noted that the present invention is described in the following with reference to a standard backplane (AMC-backplane) and a special purpose backplane (RTM-backplane). Preferably, the standard backplane is configured for processing high-speed asynchronous (digital) signals, and the special purpose backplane is configured for processing high-precision synchronous (analog) signals. However, the present invention is not restricted to these types of signals. In general, the same type of signals, similar signal or completely different types of signals can be processed by the respective backplanes and the corresponding modules coupled to these backplanes. It is also possible, that mixtures of different types of signals can be processed by each of the backplanes and/or corresponding modules.

By providing the additional special purpose backplane (RTM-backplane) to the existing standard backplane (AMC-backplane), the following advantages can be reached:

The common usage of ultra-fast digital bus systems and high precision analog modular applications within the crate system are made possible because of a strict separation of analog distributed (RTM sided) signals and digital distributed (AMC sided) signals.

The RTM ultra-phase stable distribution of analog single-ended point-to-point interconnections of high-frequency signals in the GHz range within the crate system with high stability in the femtosecond-range can be realized.

The RTM high-precision distribution of digital point-to-point interconnections of ultra low-clock jitter differential signals within the crate system with high stability in the sub-picosecond range can be realized.

A separate analog high-performance managed power supply distribution dedicated only for RTM modules can be provided.

By minimization of electromagnetic interferences, the RTM cable management reliability, maintainability and performance of entire crate system can be increased.

The capabilities of unused areas in the crate system can be extended by providing eRTM (extended RTM) modules in the rear crate zone.

The crate system architecture and the backplane configuration (e.g. RTM-backplane configuration) of the present invention are particularly suitable for applications where multichannel RF front-ends or analog signal conditioning modules are used together with powerful digital signal processing and data computation systems in a common crate system.

According to a preferred embodiment of the present invention, a standard backplane (e.g. AMC-backplane) is mechanically coupled to a separate special purpose backplane (e.g. RTM-backplane). Thus, the exemplary AMC-backplane and the exemplary RTM-backplane are spatially separated from each other by a distance which is sufficient such that electromagnetic interferences between the AMC-backplane and the RTM-backplane are eliminated or at least minimized. A spatial separation of the backplanes guarantees a controlled guidance of return currents from loads within each backplane ground system to minimize their interferences.

Preferably, the AMC-backplane and the RTM-backplane are connected to each other by means of fixing bars or other connection means. In a preferred embodiment, the RTM-backplane and the AMC-backplane (both with about ten (10) to twenty (20) layers) have a thickness of between about two (2) mm and about ten (10) mm, preferably between about three (3) mm and about seven (7) mm, and most preferred between about four (4) mm and about six (6) mm. The distance between the RTM-backplane and the AMC-backplane is preferably between about three (3) mm and about twenty (20) mm, more preferred between about four (4) mm and about ten (10) mm, and most preferred between about five (5) mm and about seven (7) mm.

It is further preferred that the space between the two backplanes (e.g. the RTM-backplane and the AMC-backplane) is filled with a material suitable for reducing electromagnetic interferences between the two backplanes.

When the RTM-backplane is mechanically connected or coupled to the AMC-backplane, with a spatial distance therebetween, the rear surface of the RTM-backplane and the rear surface of the AMC-backplane are facing each other. The respective front surfaces of the RTM-backplane and the AMC-backplane are facing in opposite directions. Thus, the AMC-backplane and the RTM-backplane, when coupled to each other in a spaced arrangement, form a sandwich-structure with a space layer therebetween, wherein the space layer is formed by ambient air or an insulating material. The front surfaces of both backplanes are adapted to be coupled with suitable modules (e.g. AMC modules and RTM modules, respectively). Therefore, in the assembled configuration of the exemplary crate system, RTM modules are coupled to the outer front surface of the RTM-backplane, and AMC modules are coupled to the outer front surface of the AMC-backplane. Each of the backplanes may be provided or coupled with one or more modules of different types. Therefore, in the assembled exemplary configuration, several RTM modules are arranged at one side of the AMC/RTM-backplane structure, and several AMC modules are arranged at the opposite side thereof. By means of this architecture, the AMC modules and the RTM modules (and the corresponding backplanes) are spatially separated from each other to avoid any unwanted interferences therebetween. This is an important feature as the RTM modules are generally intended for processing high-precision analog signals, whereas the AMC modules are generally intended for processing high-speed digital signals.

This summary is provided to introduce a selection of concepts in a simplified form. These concepts are further described below in the detailed description of the preferred embodiments. This summary is not intended to identify key features or essential features of the claimed subject matter, nor is it intended to be used to limit the scope of the claimed subject matter.

Various other aspects and advantages of the present invention will be apparent from the following detailed description of the preferred embodiments and the accompanying drawing figures.

BRIEF DESCRIPTION OF THE DRAWING FIGURES

Figure 2:
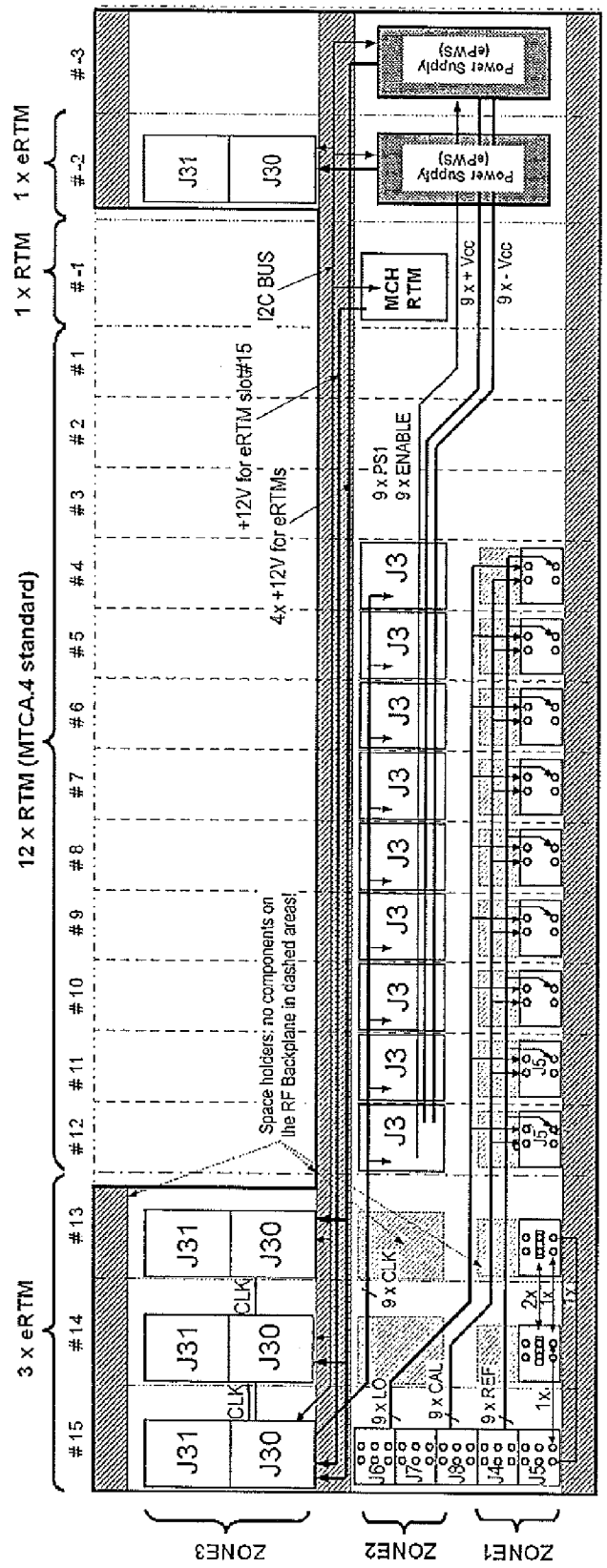

It is noted that the above described AMC-backplane (and AMC modules) and RTM-backplane (and the RTM modules) are described merely as a preferred embodiment of the present invention. This preferred embodiment will now be described, by way of example only, with reference to the accompanying drawings of which FIG. 1 is a cross-sectional view through the backplane configuration of the present invention, and shows a front AMC module and a rear RTM module coupled to the AMC-backplane and to the RTM-backplane, respectively, and FIG. 2 is a rear view of the RTM-backplane showing the RTM-backplane occupation and interconnections used in an exemplary MTCA.4 crate system.

The drawing figures do not limit the present invention to the specific embodiments disclosed and described herein. The drawings are not necessarily to scale, emphasis instead being placed upon clearly illustrating the principles of the preferred embodiments.

DETAILED DESCRIPTION OF THE PREFERRED EMBODIMENTS

The present invention is susceptible of embodiment in many different forms. While the drawings illustrate, and the specification describes, certain preferred embodiments of the invention, it is to be understood that such disclosure is by way of example only. There is no intent to limit the principles of the present invention to the particular disclosed embodiments.

FIG. 1 shows an embodiment of the RTM-backplane configuration 1 of the present invention intended for use in an exemplary MTCA.4 crate standard system. The RTM-backplane configuration includes an RTM-backplane 2 (shown in cross-section) which is located on the back side of the crate system behind the standard AMC-backplane 3 (also shown in cross-section). The RTM-backplane 2 is secured by special fixing bars 4 to the standard AMC-backplane 3 of the MTCA.4 crate. By means of the fixing bars 4 the RTM-backplane 2 is mounted with a distance and in parallel to the AMC-backplane 3. A preferred distance between the RTM-backplane 2 and the AMC-backplane 3 is between about four (4) mm and about ten (10) mm, preferably about five (5) mm. Additional bars 5 (only one bar 5 is shown in FIG. 1) or similar attachment means are attached to the RTM-backplane 2 and/or to the AMC-backplane 3 for securing the RTM-backplane 2 and/or the AMC-backplane 3 to the crate system.

As further shown in FIG. 1, an RTM module 6 is electrically coupled to the RTM-backplane 2, and an AMC module 7 is electrically connected to the AMC-backplane 3. FIG. 1 also shows analog and digital interconnections between the RTM module 6 and the RTM-backplane 2 which are realized in Zone1 and Zone2. For example, analog interconnections between several RTM modules 6 coupled in parallel and arranged adjacent to each other are realized by multi coaxial high frequency connectors localized in Zone1, and digital interconnections between the several RTM modules 6 and the optional power supply distribution are transmitted via connectors in Zone2. Further, the rear RTM modules 6 are adapted to be directly connected to the front AMC modules 7 by connectors localized in Zone3 providing for RTM power supply, IPMI-based management, hot-swap signals and user defined IO signals.

FIG. 2 shows a top view of the RTM-backplane of FIG. 1. In particular, FIG. 2 shows the slot occupation for the RTM modules 6, the signal distribution and the interconnections for extending the exemplary MTCA.4 standard.

As shown in FIG. 2, the RTM-backplane 2 is adapted for receiving two eRTM modules in slot #-2, one RTM module in slot #-1, twelve RTM modules in slot #1 to slot #12, and three eRTM modules in slot #13 to slot #15. It is noted that the shown configuration is merely an example, and that other configurations, i.e. different numbers of slots and/or slot architectures, are possible. It is further shown in FIG. 2 that the standard RTM modules localized in slot #1 to slot #12 are directly connected to corresponding AMC modules by means of the connectors localized in Zone3. Further, the RTM-backplane 2 is adapted to connect and provide power management for eRTM modules (special extended-RTM modules) located in slot #-2, slot #13, slot #14 or slot #15.

Thus, the RTM-backplane of FIGS. 1 and 2 allows standard rear RTM modules to be connected via connectors in Zone3 to the corresponding front AMC modules for slot #1 to slot #12. Further, by using the RTM-backplane concept of the present invention, slot #-1 to slot #-3, and slot #13 to slot #15 are unused areas in the MTCA.4 standard and can be used for extended RTM modules (eRTMs). These areas can be used as high frequency sources, local clock generators or low noise power supplies. Those slots are six (6) HP wide.

It is obvious from FIG. 2 that the RTM-backplane 2 of the present invention is adapted to distribute high frequency signals from the eRTM module located in slot #15 point-to-point to each RTM module located in slot #4 to slot #12 in Zone1. For example, clock signals (CLK) can be distributed by point-to-point connections realized by electrical connections between connector J30 in Zone3 of slot #15 to connector J3 in Zone2 of slot #4 to slot #12. In this exemplary case, the above mentioned electrical connections are adapted to transmit a local reference (LO), a reference (REF) and a calibration signal (CAL), totally 3×9 ultra-stable high frequency signals in the GHz frequency range, for example, from connectors J6, J7, J8, J4 in Zone1 and Zone2 of slot #15 to connector J5 in Zone1 of slot #4 to slot #12. Further, digital ultra low-clock jitter differential signals from the eRTM module in slot #15 at Zone3 are distributed via the RTM-backplane point-to-point to each of the RTM modules located in slot #4 to slot #12 in Zone2 using the connectors J3. In general the distribution of high frequency signals and clock signals can be done also between RTM modules using connectors J5 and J3. Especially, when using smaller crate form factors with no eRTMs, RTMs would take the reduced functionality of the eRTMs.

In addition, the eRTM modules may have a high-frequency point-to-point connection and a digital connection for data transmission and communication. In a preferred configuration, slot #-2 and slot #-3 can also be used for receiving extended redundant power supply modules (ePWS) which ePWS modules may provide a high performance power supply for RTM modules located in slot #4 to slot #12 via the RTM-backplane 2 and may provide power for the eRTM modules. The management of the ePWS module is provided by a MicroTCA Carrier Hub (MCH) RTM in slot #-1 which is fully integrated in the MTCA.4 crate standard. This MCH RTM provides power management via I2C communication and data transmission to the eRTM modules.

To maintain the signal-integrity in the RTM-backplane configuration of the present invention for signals with femtosecond-stability, the signal routing is fully shielded by means of a multi-layer design to achieve signal crosstalk in Zone1 far below negative eighty (−80) dB. In a preferred embodiment, the RTM-backplane is fully covered by a separate metal shield at one side to minimize cross talks and electromagnetic interferences from the digital AMC-backplane signals.

The mechanical extension of the RTM-backplane of the present invention is configured such that standard RTM modules can be connected to all RTM slots of the crate (slot #1 to slot #12) and will not collide mechanically with the RTM backplane. RTM modules should support a voltage coded information about usage of pins in coaxial connectors. This information can be used by the eRTM module in slot #15 to automatically terminate unused high frequency outputs. Connectors in Zone3 should be located in the same physical height as standard MTCA.4 RTM connectors.

From the above, it is obvious that the present invention covers the case where RF/clock signals are sent/received within the standard RTM slots (i.e. slot #4 to slot #12), and not exclusively from the eRTM area. For some applications, analog signal exchange might be desired from one RTM to the other RTM. Further, conventional six/four (6/4) slot crates do not have any eRTM slots, and an RTM would take the (reduced) functionality of the eRTM. In this case, the J4 connector, for example, could be added at one slot to supply to four (4) neighbouring slots with three (3) RF signals each.

Finally, additional connectivity could be provided, for example, for the RF signals in Zone1 from the middle pins J5 to each neighbouring slot (daisy chain). Similar electrical interconnections can also be provided in Zone2.

The preferred forms of the invention described above are to be used as illustration only and should not be utilized in a limiting sense in interpreting the scope of the present invention. Obvious modifications to the exemplary embodiments, as hereinabove set forth, could be readily made by those skilled in the art without departing from the spirit of the present invention.

The inventors hereby state their intent to rely on the Doctrine of Equivalents to determine and assess the reasonably fair scope of the present invention as pertains to any apparatus not materially departing from but outside the literal scope of the invention set forth in the following claims.

What is claimed is:

1. A backplane configuration for use in an electronic crate system, said backplane configuration comprising:
   a first-type backplane;
   a second-type backplane;
   wherein the first-type backplane is coupled to the second-type backplane by a mechanical connection;
   wherein the first-type backplane and the second-type backplane are spatially separated from each other by a distance;
   wherein the first-type backplane is adapted to be electrically coupled with at least one first-type module, and the second-type backplane is adapted to be electrically coupled with at least one second-type module; and
   wherein the first-type backplane is an AMC-backplane (AMC=Advanced Mezzanine Card), the second-type backplane is an RTM-backplane (RTM=Rear Transition Module),
   wherein the first-type module is an AMC module, and the second-type module is an RTM module.

2. The backplane configuration according to claim 1, wherein the first-type backplane is a standard crate backplane, the second-type backplane is a special purpose backplane, and
   wherein the first-type module is a standard module, and the second-type module is a special purpose module.

3. The backplane configuration according to claim 1, said first-type backplane having a rear surface and a front surface, the second-type backplane having a rear surface and a front surface,
   said rear surfaces of the first-type backplane and the second-type backplane facing each other, and the front surfaces of the first-type backplane and the second-type backplane facing in opposite directions.

4. The backplane configuration according to claim 1, wherein the first-type backplane and the second-type backplane, when coupled to each other in a spaced arrangement, form a sandwich-structure with a space layer therebetween,
   wherein the space layer is formed by ambient air or an insulating material.

5. The backplane configuration according to claim 1, wherein opposite facing front surfaces of both backplanes are adapted to be coupled with first-type modules and second-type modules, respectively, and
   wherein, in the assembled configuration of the crate system, the first-type modules are coupled to the outer front surface of the first-type backplane, and the second-type modules are coupled to the outer front surface of the second-type backplane.

6. The backplane configuration according to claim 1, wherein the first-type backplane and the second-type backplane are provided with a plurality of electrical slots adapted for receiving corresponding first-type modules and second-type modules, respectively, which slots are electrically connected to each other by means of plural layers of electrical conductors.

7. The backplane configuration according to claim 1, wherein the first-type backplane and the second-type backplane are connected to each other by means of fixing bars such that the distance between the first-type backplane and the second-type backplane is between 4 mm and 10 mm.

8. The backplane configuration according to claim 1, wherein the second-type backplane is located on a back side of the crate system behind the first-type backplane.

9. The backplane configuration according to claim 1, wherein at least one of the first-type modules coupled to the first-type backplane is adapted to be directly connected to a respective one of at least one of the second-type modules coupled to the second-type backplane.

10. The backplane configuration according to claim 1, wherein at least one first-type module is coupled to a forward facing surface of the first-type backplane, and at least one second-type module is coupled to an opposite rearward facing surface of the second-type backplane.

11. The backplane configuration according to claim 1, wherein the backplane configuration is used in an MTCA.4 (Micro Telecommunication Computing Architecture) crate system.

12. An electronic crate system comprising the backplane configuration according to claim 1.

13. The backplane configuration according to claim 1, wherein the distance spans a space between the first-type backplane and the second-type backplane,
    wherein the space is filled with a material suitable for reducing electromagnetic interferences between the RTM-backplane and the AMC-backplane.

14. A backplane configuration for use in an electronic crate system, said backplane configuration comprising:
    a first-type backplane;
    a second-type backplane;
    wherein the first-type backplane is coupled to the second-type backplane by a mechanical connection;
    wherein the first-type backplane and the second-type backplane are spatially separated from each other by a distance;
    wherein the first-type backplane is adapted to be electrically coupled with at least one first-type module, and the second-type backplane is adapted to be electrically coupled with at least one second-type module; and
    wherein the distance spans a space between the first-type backplane and the second-type backplane,
    wherein the first-type backplane is an AMC-backplane (AMC=Advanced Mezzanine Card), the second-type backplane is an RTM-backplane (RTM=Rear Transition Module),
    wherein the space is filled with a material suitable for reducing electromagnetic interferences between the RTM-backplane and the AMC-backplane.

15. The backplane configuration according to claim 14, wherein the first-type backplane is a standard crate backplane, the second-type backplane is a special purpose backplane, and
    wherein the first-type module is a standard module, and the second-type module is a special purpose module.

16. The backplane configuration according to claim 14,
said first-type backplane having a rear surface and a front surface, the second-type backplane having a rear surface and a front surface,
said rear surfaces of the first-type backplane and the second-type backplane facing each other, and the front surfaces of the first-type backplane and the second-type backplane facing in opposite directions.

17. The backplane configuration according to claim 14,
wherein the first-type backplane and the second-type backplane are connected to each other by means of fixing bars such that the distance between the first-type backplane and the second-type backplane is between 4 mm and 10 mm.

18. The backplane configuration according to claim 14,
wherein opposite facing front surfaces of both backplanes are adapted to be coupled with first-type modules and second-type modules, respectively, and
wherein, in the assembled configuration of the crate system, the first-type modules are coupled to the outer front surface of the first-type backplane, and the second-type modules are coupled to the outer front surface of the second-type backplane.

19. An electronic crate system comprising the backplane configuration according to claim 14.

* * * * *